United States Patent [19]

Sprenger et al.

[11] Patent Number: 4,485,149
[45] Date of Patent: Nov. 27, 1984

[54] HIGHLY TEMPERATURE-RESISTANT, WEAR-RESISTANT WORKPIECES AND METHOD FOR THEIR MANUFACTURE

[75] Inventors: Heinz Sprenger; Christoph Scholz, both of Munich, Fed. Rep. of Germany

[73] Assignee: Maschinenfabrik Augsburg-Nurnberg Aktiengesellschaft, Munich, Fed. Rep. of Germany

[21] Appl. No.: 351,147

[22] Filed: Feb. 22, 1982

[30] Foreign Application Priority Data

Feb. 26, 1981 [DE] Fed. Rep. of Germany ....... 3107217

[51] Int. Cl.$^3$ ............................................ C23C 11/00
[52] U.S. Cl. ..................................... 428/627; 428/660
[58] Field of Search ............... 428/610, 627, 660, 680, 428/679

[56] References Cited

U.S. PATENT DOCUMENTS 3,284,174 11/1966 Zimmer ................................ 428/633
3,640,689 2/1972 Glaski et al. ......................... 428/627
4,101,703 7/1978 Schintlmeister ..................... 148/31.5
4,357,382 11/1982 Lambert et al. ..................... 428/216
4,380,574 4/1983 Gessinger et al. .................. 428/686

FOREIGN PATENT DOCUMENTS 2528255 2/1976 Fed. Rep. of Germany ...... 428/627
47-34578 8/1972 Japan ................................... 428/684
53-45607 4/1978 Japan ................................... 428/627

OTHER PUBLICATIONS

*Nachschlagewerk Stahlschlussel,* 10th edition, Verlag Stahlschlüssel Wegst. KG, pp. 289, 290 (1974).
Buehler, W. J. et al.; "Effect of Low-Temperature Phase Changes on the Mechanical Properties of Alloys Near Composition TiNi", J. App. Phy., vol. 34 pp. 1475–1477 (1963).
Cubberly, W. H. et al.; *Metals Handbook* 9th Edition, Am. Soc. for Metals, pp. 207–210, 214, 215, 456–458; (1980).

*Primary Examiner*—L. Dewayne Rutledge
*Assistant Examiner*—Robert L. McDowell
*Attorney, Agent, or Firm*—Posnack, Roberts, Cohen & Spiecens

[57] ABSTRACT

A workpiece of a highly heat-resistant steel containing nickel or of a nickel-base alloy is provided with a hard coating containing titanium. An intermediate layer of an intermetallic phase $Ni_3Ti$ intervenes between the core material and the hard coating. The deposition of the intermediate layer of the hard coating is achieved by means of separation in a gaseous phase.

5 Claims, 2 Drawing Figures

HIGHLY TEMPERATURE-RESISTANT, WEAR-RESISTANT WORKPIECES AND METHOD FOR THEIR MANUFACTURE

FIELD OF THE INVENTION

This invention relates to workpieces of, for example, highly heat-resistant steel containing Ni or of a nickel-base alloy having a coating of a hard substance containing Ti.

BACKGROUND

Workpieces which at high service temperatures (800° C. and over) are subjected to considerable mechanical stress of a static as well as dynamic nature have normally been made of costly materials difficult to machine, such as tantalum, tungsten, molybdenum or of hard metals or hard substances, such as carbides, nitrides or the like.

If it is intended to combine in workpieces the properties of highly heat-resistant alloys, such as creep strength, with improved surface properties, such as resistance to friction and wear, resort is conventionally made to coating the pieces with hard materials by chemical gaseous phase separation, pack cementing, plasma spraying or similar methods. In the resulting product, the strength of the workpiece is characterized by the mechanical properties of the base alloy. Surface properties, such as resistance to wear or corrosion, are governed by the properties of the hard substance used in the coating.

In actual technical applications, however, various problems can arise. For example, as a result of the very unlike coefficients of thermal expansion between the base material and the coating material, lateral stresses may occur under alternating thermal loads in service at the steel/hard substance interface. These may induce cracks in the coating and cause it to separate. Under mechanical peaking loads acting at right angles to the surface, the ductile base material under the coating threatens to yield, causing the thin and brittle hard coating to collapse. It has therefore been necessary to produce staged joining systems between the hard surface layer and the base material via multiple coatings. This normally involves a large number of process operations, however, and makes production complex and costly.

SUMMARY OF THE INVENTION

In a broad aspect of the present invention, workpieces are provided which, despite the simple coating method used, will still resist notable thermal and mechanical stresses. The invention further provides methods for their simple and economical manufacture.

It is a particular object of the present invention to provide improved workpieces of a type which exhibits, between its core and hard surface layer, an intermediate layer intimately associated with the core.

In achieving the above and other objects of the invention, there is provided a workpiece which comprises a core of highly heat-resistant steel containing nickel or of a nickel-base alloy, at least one hard coating including titanium, and an intermediate layer of an intermetallic phase $Ni_3Ti$ intervening between the core and the hard coating and intimately associated with the core.

According to a feature of the invention, the hard coating is of a material selected from a group consisting of TiC, TiN, Ti (B,N), $TiB_2$ and Ti (C,N).

According to a further feature of the invention, the workpiece comprises on top of the $Ni_3Ti$ intermediate layer at least two of the aforementioned hard coating layers, said layers being of different compositions.

According to another aspect of the invention, there is provided a workpiece comprising a heat-resistant steel including nickel or a nickel-base alloy and an $Ni_3Ti$ coating on the steel. The core may consist of a nickel-base alloy selected from the group consisting of NiCr 15 Fe, NiCr 21 Mo Nb, and NiCr 22 Fe 18 Mo.

According to yet another aspect of the invention, there is provided a method for the manufacture of a workpiece of the aforenoted type comprising exposing an uncoated core of a heat-resistant steel or of a nickel-base alloy to a gas mixture of $Ti Cl_4$, $H_2$ and reaction gas at a temperature of from 800° to 1,000° C. and at a pressure of from 32 to 1,000 mbar.

Other features of the invention find the gas mixture provided with a constant $Ti Cl_4$ content and a remainder, the percentage composition of which is selected to control the content of $Ni_3Ti$ and provide a hard coating material. The reaction gas may be at least one of the group consisting of $N_2$, $CH_4$, $CCl_4$, $BCl_3$ and $BBr_3$.

The method of the invention may also be regarded as comprising exposing an uncoated core of heat-resistant steel or of a nickel-base alloy to a gas mixture of $TiCl_4$ and $h_2$ at the foresaid temperatures and pressures. Therein, the $TiCl_4$ content may range from 0.5 to 4% by volume. In a variation, the percent composition of the remainder is varied after a first time interval. During the first time interval the remainder may contain exclusively $H_2$. In this method, the qualitative composition of the gas mixture may, in a variation, be varied in successive steps.

Other objects, features and advantages of the invention will be found in the detailed description which follows hereinafter.

DETAILED DESCRIPTION

Figure 1:
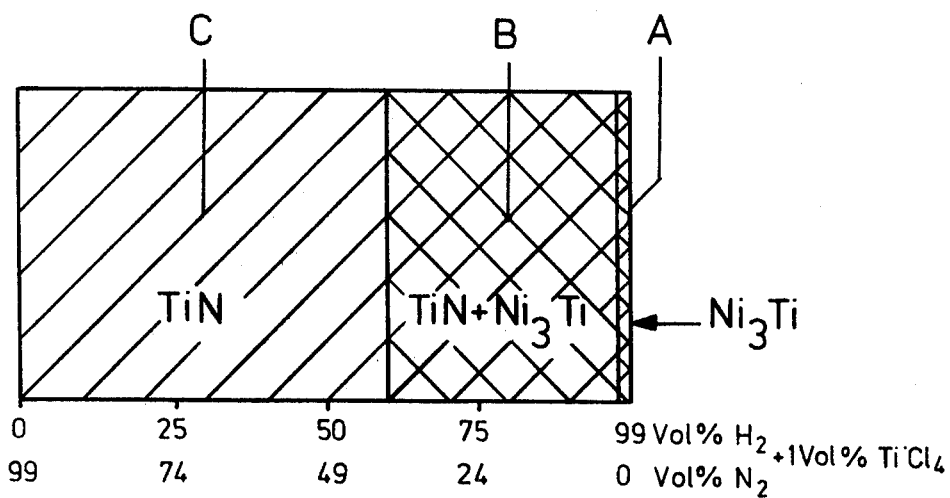
FIG. 1 is a separation diagram showing the relationship of a gaseous phase to coating composition in accordance with one embodiment of the invention.

Unlike the presently practiced multiple-coating techniques which resort to a succession of hard-material layers of different properties, the present invention makes resort only to a single hard coating and an intermediate layer of said intermetallic phase. The intermediate layer enters into a firm and extremely well bonded union with the austenitic base material. The mechanical properties of the intermetallic phase $Ni_3Ti$ range between those of the ductile austenite and the brittle hard coating as regards hardness, brittleness, coefficient of thermal expansion and creep strength. The $Ni_3Ti$ intermediate layer, therefore, is a perfect go-between mechanically between the top layer and the core material.

As a top layer, use is preferably made of a continuous close-grained hardfacing, such as TiC, TiN, Ti (C,N), $TiB_2$ or Ti (B,N).

In a further aspect of the present invention, two or more hard coatings of different compositions are applied over the Ni$_3$Ti intermediate layer to produce the specific service properties required for the intended application of the workpiece.

In still a further aspect of the present invention, a workpiece of highly heat-resistant steel containing Ni or of nickel-base alloy is provided with an Ni$_3$Ti coating as an only surface layer. This coating will give extremely good resistance to nickel steels and alloys against carbonizing in carbon-laden hot operating gases for the reason that the intermetallic phase Ni$_3$Ti exhibits no measurable solubility for carbon. In process gases high in carbon, titanium carbide will form on the intermetallic phase Ni$_3$Ti. Formation of this protective TiC hard facing will inhibit continued carbon diffusion into steels and alloys containing nickel.

As a core material for workpiece coated in accordance with the present invention, use is preferably made of nickel-base alloys, such as NiCr 15 Fe or NiCr 21 Mo Nb or NiCr 22 Fe 18 Mo.

The present invention also relates to methods for manufacturing workpieces covered by the present invention. Said methods of the present invention are characterized in that the uncoated core of a highly heat-resistant steel or of a nickel-base alloy is exposed to the action of a gas mixture of TiCl14, H$_2$ and a reaction gas, such as N$_2$, CH$_4$, CCl$_4$, N$_2$+CH$_4$, BCl$_3$ or BBr$_3$ at temperatures from 800° to 1000° C. and pressures from 30 to 1000 mbar. To what degree an intermediate Ni$_3$Ti layer will then develop depends on the hydrogen/reaction gas ratio selected. In order to achieve an intended type of coating, then it is sufficient to select the composition of the gaseous phase accordingly. Thus, for a high Ni$_3$Ti content, a high H$_2$ content is selected. The remaining process parameters, such as separation temperature, total pressure and gas flow, can be selected freely within wide tolerances, considering that they will but little affect the separation equilibriums.

The cardinal advantage afforded by the present invention is that it permits multiple layers to be produced in a single operation, said layers being characterized by their mechanical high temperature properties. All phases are in equilibrium thermodynamically, so that no injurious diffusion reactions that might dissolve the layers or individual contents thereof will occur in long-term service.

The gas mixture preferably contains a constant TiCl$_4$ content and a remainder the percent composition of which is selected to suit the intended Ni$_3$Ti and hard coat substance content. The hard substance produced varies with the reaction gas selected. If N$_2$ is selected as a reaction gas, the hard substance will be TiN. If CH$_4$ or CCl$_4$ is the reaction gas, TiC will be produced, while a mixture of N$_2$ and CH$_4$ will produce Ti (C, N), and BCl$_3$ or BBr$_3$ will produce a TiB$_2$ coating. If for some reason the reaction gas cannot exceed certain concentrations, part of the reaction gas can be replaced with inert gas, such as argon or helium.

For each of these systems Ni—Ti—Cl$_4$—X—H$_2$, separation diagrams can be prepared. Of these, an example is represented in FIG. 1 (nickel-base alloy, 61% nickel, material designation 2.4856 per DIN 17007 in the U.S. well known under trade name Inconel 625$^R$ /, TiCl$_4$—N$_2$—H$_2$). Using this system the hard substance coatings are deposited as a function of the gaseous phase composition. From these separation diagrams it will readily become apparent which composition of the gaseous phase should be selected to produce a certain composition of coating. For the manufacture of a duplex coating consisting of the intermetallic phase Ni$_3$Ti and a top coat of TiN, the proper composition to select per point B would be 80% H$_2$, 19% N$_2$, 1% TiCl$_4$. A special advantage is here afforded by the relative wide range of gaseous phase compositions that give a uniform separation product, which eliminates the need for complex control provisions.

In order to produce a workpiece exhibiting only a coating of Ni$_3$Ti, an uncoated core of a highly heat-resistant steel or of a nickel-base alloy is exposed, in a further aspect of the present invention, to a gas mixture of TiCl$_4$ and H$_2$ at temperatures of 800° to 1000° C. and pressures of 30 to 1000 mbar, where the TiCl$_4$ content is preferably held between 0.5 and 4% by volume. The arrangement in FIG. 1 shows this type of coating at point A. The gaseous phase composition accordingly is 99% by volume H$_2$ and 1% by volume TiCL$_4$. The core material is a nickel-base alloy (material designation 2.4856 per DIN 17007).

Using the same method, the steel minority component titanium can be enriched in the form of the intermetallic phase Ni$_3$Ti (which means no diffusion zone) in a thin surface zone (of some $\mu$), which will drastically improve the resistance of the steel against oxidation and carburizing.

In accordance with a further aspect of the present invention, the percent composition of the remainder of the gas mixture is varied after a first time interval. In this manner, it will be possible, e.g., to deposit an additional layer of straight TiN, by adjusting the gas phase composition accordingly as shown at point C, after deposition of the duplex layer in accordance with B in FIG. 1.

In accordance with still a further aspect of the present invention, the qualitative composition of the gas mixture is varied after a time. After a first time interval, e.g., using a gas mixture composition in accordance with point C in FIG. 1, the composition of the gas mixture is altered such that the N$_2$ content is replaced with CH$_4$. In this manner, a layer of TiC develops on the surface; and a triplex layer is thus formed of the always indispensible Ni$_3$Ti phase, of a TiN layer thereon, and of a TiC top coat layer. This enables a staged transition to be achieved of operationally important physical properties from the base material to the top layer.

Figure 2:
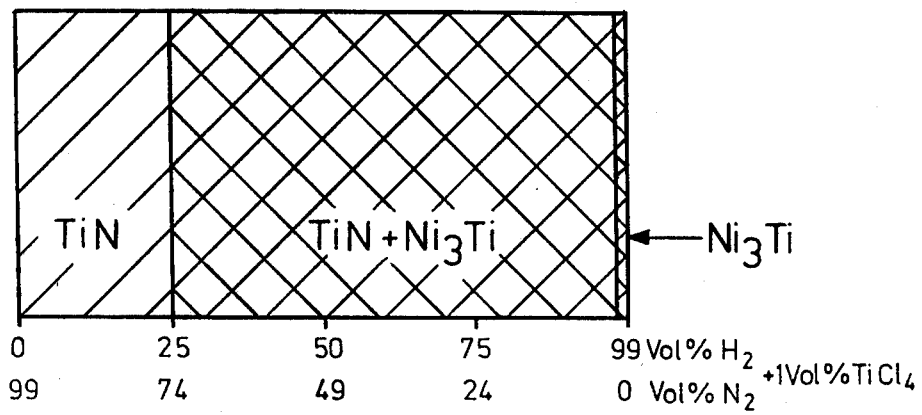
FIG. 2 is another separation diagram for a base material of nickel.

FIG. 2 is another separation diagram which like that in FIG. 1 again relates to the Ni—TiCl$_4$—N$_2$—H$_2$ system, but where the base material is straight nickel.

Several examples of the manufacture of workpieces produced in accordance with the present invention using said methods are described below.

EXAMPLE 1

If an alloy containing nickel (e.g. material designation No. 2.4856, 2.4665 in the U.S. well known under the trade name Hastelloy X, 2.4816 in the U.S. well known under the trade name Inconel 600, or the like per DIN 17007) is coated at 1000° C., 50 mbar, gas flow 4 ltr/min, 93% by volume H$_2$, 4% by volume CH$_4$, 3% by volume TiCl$_4$, the resulting protective layer consists of Ni$_3$Ti and TiC, where the Ni$_3$Ti is firmly anchored in the austenitic base material. Next follows a zone of close-grained Ni$_3$Ti and TiC mixed. The top layer is straight titanium carbide. Static compression tests and wear tests at 100° C. have shown such layers to have considerable strength and their creep life to be prolonged by a factor of 10 over that of conventional hard coatings.

EXAMPLE 2

As shown in Example 1, the coating process can utilize TiN, TiB$_2$, Ti (C,N), Ti (B,N) to achieve a coating of analogous structure and similar properties.

EXAMPLE 3

An alloy containing nickel is subjected for a duration of, e.g., 2 hours and at 800° C. to an atmosphere consisting of 99% by volume H$_2$ and 1% by volume TiCl$_4$. The workpiece is thereby coated with a continuous 5μ to 10μ Ni$_3$Ti layer of good bonding strength. In a corrosive atmosphere, this coating will excellently protect the steel from carbonizing. In an atmosphere of severe carbon activities, Ni$_3$Ti will, in part, slowly convert into TiC to form a thin protective hard coating. Additionally, when steels containing molybdenum are coated with Ni$_3$Ti, a zone high in Mo forms directly under the coating to give additional protection from corrosion.

EXAMPLE 4

If for some reason it is intended to produce a particularly thick intermediate Ni$_3$Ti layer, the procedure to follow is first that described in Example 3 to obtain a straight Ni$_3$Ti coating. The composition of the gas is then varied during the process to a value corresponding to point B in FIG. 1. This produces another coating layer, as previously described in Example 1, which consists of intimately mixed Ni$_3$Ti and TiN contents but has an upper zone of straight TiN.

EXAMPLE 5

After the coating process described in Example 4, it is possible, by adjusting the gaseous phase, to achieve a composition as described in Example 1 and to produce an additional coating layer of TiC. The resulting triplex coating consisting of Ni$_3$Ti, TiN and TiC provides excellent protection from friction and wear at elevated temperatures, because of the great hardness of the TiC on the surface. Compared with the generation of a duplex layer consisting of Ni$_3$Ti and TiC per Example 1, said process provides an advantage in that it considerably shortens the total time of deposition at the same total thickness of coating.

What is claimed is:

1. A workpiece comprising a core of heat-resistant steel containing nickel or of a nickel-base alloy, at least one hard coating including a titanium compound and intermediate layer consisting of an intermetallic phase Ni$_3$Ti intervening between the core and the hard coating and intimately associated with the core.

2. A workpiece as claimed in claim 1 wherein the hard coating is a material selected from the group consisting of TiC, TiN, Ti (C,N), TiB$_2$ and Ti (B,N).

3. A workpiece as claimed in claims 1 or 2 comprising on top of the continuous Ni$_3$Ti intermediate layer, at least two of said hard coating layers, said layers being of different compositions.

4. A workpiece comprising heat-resistant steel including nickel or of a continuous, protective nickel-base alloy, and a coating consisting of Ni$_3$Ti on said steel.

5. A workpiece as claimed in claims 1, 2 or 4 wherein the core consists of a nickel-base alloy selected from the group consisting of NiCr 15 Fe, NiCr 21 Mo Nb, and NiCr 22 Fe 18 Mo.

* * * * *